United States Patent
Russell

(10) Patent No.: US 7,584,384 B2
(45) Date of Patent: Sep. 1, 2009

(54) METHOD AND APPARATUS FOR ENABLING AND DISABLING A TEST MODE OF OPERATION OF AN ELECTRONIC MEMORY DEVICE WITHOUT ADDITIONAL INTERCONNECTS OR COMMANDS

(76) Inventor: Robert J. Russell, 297 K St., South Boston, MA (US) 02127

( * ) Notice: Subject to any disclaimer, the term of this patent is extended or adjusted under 35 U.S.C. 154(b) by 484 days.

(21) Appl. No.: 11/222,474

(22) Filed: Sep. 7, 2005

(65) Prior Publication Data

US 2006/0053358 A1    Mar. 9, 2006

Related U.S. Application Data

(60) Provisional application No. 60/607,669, filed on Sep. 7, 2004.

(51) Int. Cl.
  *G06F 11/00* (2006.01)
  *G11C 29/00* (2006.01)
(52) U.S. Cl. .......................................... 714/36; 714/718
(58) Field of Classification Search .................... 714/36
  See application file for complete search history.

(56) References Cited

U.S. PATENT DOCUMENTS

| | | | | | |
|---|---|---|---|---|---|
| 4,584,663 | A | * | 4/1986 | Tanikawa | 714/49 |
| 4,654,849 | A | * | 3/1987 | White et al. | 714/718 |
| 5,161,159 | A | * | 11/1992 | McClure et al. | 714/724 |
| 5,631,698 | A | * | 5/1997 | Lee | 348/178 |
| 5,706,232 | A | * | 1/1998 | McClure et al. | 365/201 |
| 5,936,974 | A | * | 8/1999 | Roberts et al. | 714/718 |
| 6,310,815 | B1 | * | 10/2001 | Yamagata et al. | 365/230.03 |
| 6,335,887 | B1 | * | 1/2002 | Aoki et al. | 365/201 |
| 6,560,665 | B1 | * | 5/2003 | Resler et al. | 710/305 |
| 7,096,386 | B2 | * | 8/2006 | Ozawa | 714/30 |
| 7,107,493 | B2 | * | 9/2006 | Nguyen et al. | 714/42 |
| 7,155,370 | B2 | * | 12/2006 | Nejedlo | 702/186 |
| 7,206,970 | B1 | * | 4/2007 | Lauterbach et al. | 714/36 |
| 2004/0186688 | A1 | * | 9/2004 | Nejedlo | 702/186 |
| 2005/0039081 | A1 | * | 2/2005 | Chang et al. | 714/36 |

* cited by examiner

*Primary Examiner*—Cynthia Britt
*Assistant Examiner*—Guerrier Merant

(57) ABSTRACT

A method and apparatus allows an electronic device to operate, first, in a test mode and, second, in a functional mode, the functional mode being the normal operating mode of the device. In the test mode, input stimulus is processed by test circuitry to control device outputs according to a relatively simple algorithm suitable for test purposes. When the device is in test mode, the functional circuitry reacts to the input stimulus in the same manner it would when the device is in functional mode. However, when the device is in test mode the functional circuitry does not control the device outputs. During this time the functional circuitry is in an undefined state, as would be expected immediately after power application. When predefined input stimulus is applied to the device which could cause part of the functional circuitry to switch to a defined state, test mode is deactivated and functional mode activated. When so activated the functional circuitry, in addition to continuing to react to input stimulus as before, controls the device outputs. The two modes are successively achieved without requiring special external connections or special control commands. The test circuitry of the device is, therefore, essentially transparent unless specifically utilized, allowing the device to be used in systems which are not designed to utilize the test feature of the device as well as in those systems which do.

10 Claims, 3 Drawing Sheets

METHOD AND APPARATUS FOR ENABLING AND DISABLING A TEST MODE OF OPERATION OF AN ELECTRONIC MEMORY DEVICE WITHOUT ADDITIONAL INTERCONNECTS OR COMMANDS

CROSS REFERENCE TO RELATED APPLICATIONS

This is a non-provisional patent application claiming priority of provisional application for patent No. 60/607,669 filed Sep. 7, 2004.

BACKGROUND OF THE INVENTION

1. Field of Use

The present invention relates to field of electronic testing and, in particular, to the testing of printed circuit boards (PCBs). The invention more particularly relates to testing for proper connection to and from electronic devices mounted on a PCB.

2. Relevant Art

The benefits of being able to test for proper connection between the various devices mounted on PCBs has long been recognized as beneficial both in fault detection and diagnosis. That is, while testing the PCB as a functional unit is important in itself, there are advantages to separately testing the interconnects, especially in PCB designs in which the functionality is complex. Such designs are sometimes referred to as being comprised of random logic, because the challenge of testing differs from that of more straightforward designs, such as is the case with, for example, main memory units. In the latter type, the same or similar clusters of logical functions may exist in perhaps over a hundred instances. Additionally, these clusters of logical functions may be the same or similar to those functions which have existed in digital computers for decades and for which tests have been developed and perfected over time.

Various methods have been developed to address the testing challenges of interconnect testing. One such method is termed boundary scan, where a secondary layer of logic (test logic) is added to the primary layer of logic (functional logic) of each boundary scan device and controlled by extra connections to the device. IEEE Standard 1149.1 defines a method of boundary scan widely used in the industry. The IEEE Standard 1149.1 was developed as a refinement of an international industry effort termed "Joint Test Action Group" (JTAG). Presently, the term JTAG is also used to refer both to devices which are IEEE Standard 1149.1 compliant and devices which may be slightly lacking in compliance to the standard. The term IEEE 1149.1 will be used herein to include both classes of devices (i.e., completely compliant and mostly compliant).

IEEE 1149.1 devices incorporate three or four extra test input connections (TDI, TCK, TMS or TDI, TCK, TMS, TRST*, respectively) to control the internal device test logic. Such a device operates in either a functional mode or a test mode, depending on the signals received at those test input connections and upon the time interval since the device was powered up. That is, it is a norm that IEEE 1149.1 devices with only the three extra test inputs are designed to achieve a completely functional (non-test) state within a given interval after power up. It should be noted that the term "states of a device" as used herein refers to which logical layer is controlling the non-IEEE 1149.1 outputs of the device. That is, in the test state, the boundary scan layer controls most device outputs, whereas in the functional device state, the functional logic layer controls most device outputs. Exceptions are the single IEEE 1149.1 output connection (TDO), which is always controlled by the test logic, and certain other functional connections, such as analog connections, and power connections.

While the IEEE 1149.1 capability has been included on many complex devices, such as microprocessors and the like, many simple devices, such as separate groups of AND or OR gates, for example, are not available in IEEE 1149.1 versions. In the case of such simple devices, the added IEEE 1149.1 logic might be more complex than the functional logic of the device. Also, the simple logic paths that these devices provide between more complex devices are often easily testable by means of the IEEE 1149.1 circuitry extant in complex devices and automatic test pattern generation (ATPG) software commonly used to write IEEE 1149.1 test patterns. The decision not to include IEEE 1149.1 logic in a device is made by the device manufacturer, as a marketing choice. That is, the manufacturer decides whether or not the additional cost of an IEEE 1149.1 version of a device will be sufficiently welcomed in the market.

Memory devices have largely fallen into the category of devices which do not incorporate IEEE 1149.1 circuitry. Reasons for the manufacturer decisions not to include IEEE 1149.1 may be the extremely competitive nature of the memory device industry, the inherent propagation delay, however minor, of adding any circuitry to the functional connections and the PCB etching problems imposed by the IEEE 1149.1 interconnects. There may be other reasons, as well, including what may be possibly the main reason manufacturers do not include IEEE 1149.1 circuitry on most memory devices: the nature of main memory PCB designs incorporating those devices. In some key respects, the designs are very similar to those of the past and can be tested by test programs very similar to those developed over decades. These test programs generally have high fault detection and fault diagnosis capabilities. Hence, there is less to be gained by adding IEEE 1149.1 circuitry to memory devices in comparison to adding it to microprocessors, for example.

In memory device applications other than main memory applications, interconnect testing may be extremely difficult. That is, unless the memory device contains IEEE 1149.1 circuitry, its connection to one or more devices which do may not solve the test problem. For example, in a case where the memory device operation has timing requirements which cannot be met by boundary scan operations, such testing may be impossible. To address this problem, another standard has been proposed, IEEE Standard P1581 (hereinafter referred to as IEEE P1581). As with IEEE 1149.1, an IEEE P1581 device would have both a test mode and a functional mode. However, the circuitry used in the IEEE P1581 test mode would be much less complex than the circuitry required for IEEE 1149.1. The circuitry may be simple gates such as AND, NAND, OR, NOR, XOR and XNOR, connected between device inputs and outputs in predetermined patterns, although more complex logic functions, such as storage elements, are not precluded from use. These logic functions enable signals from IEEE 1149.1 circuitry in another device or devices to propagate through the memory device and stimulate inputs of the same or other IEEE 1149.1 devices. The use of simple gating in IEEE P1581 means there is a minimum of extra circuitry involved in the memory devices, although the economy of circuitry has little relative effect on the cost of device fabrication because of the small size of either type of test circuit (i.e., IEEE 1149.1 vs. IEEE P1581) in comparison to the functional circuitry of a memory of substantial size. The principal benefit of IEEE P1581 is that only one extra connection to the device is needed to select test mode or functional mode. In certain memory devices, there may even be one or more combinations of input signals which serve no functional purpose. In such instances, one or more such input signal combinations may be used to set or reset the test mode, obviating extra connections. Memory devices having such unused input signal combinations, however, are the exception rather than the rule. Therefore, incorporating an IEEE P1581 capability into a device will commonly require an otherwise unnecessary connection to the device. Even this single added connection will likely be perceived by suppliers as presenting a marketing disadvantage in main memory applications, which represents the largest market for many memory devices and where, as stated, the test advantage of IEEE P1581 is minimal because of the availability of adequate test methods which work well without the IEEE P1581 test circuitry.

Therefore, it is an objective of the present invention to provide a method of allowing a memory device to have dual operating modes (test and functional) which are achieved without extra device connections.

It is a further objective of the present invention that the stated mode selection be independent of input combinations which are unused during device functional operation.

SUMMARY OF THE INVENTION

The above and other objects of the present invention are achieved in a preferred embodiment of a method and apparatus which may be included as a layer of test logic in a logical device and, in particular, in a logical memory device.

The present invention is based on the fact that, for practical purposes, it is not necessary to activate the test layer of logic other than right after power up. That is, once the interconnect test has been performed, and the functional layer of logic has been activated, there is not necessarily a further need to return the device to the test mode of operation. The ability for the device to be in test mode only after power up and before switching to functional mode is sufficient for most practical test purposes.

The present invention is further based on the fact that logical devices with storage capabilities, known as sequential devices, power up in an unspecified state, sometimes referred to as an X-state. A simple example is the state of a D flip-flop with a single output and clock, D, set and reset inputs. The device is in an X-state directly after power is applied to it. That is, the value of the output may be either a logical zero or a logical one, the actual value being unpredictable, or unknown, except of course by examination. The unknown state continues until certain input conditions are satisfied, such as asserting the set or reset inputs or asserting the clock input in conjunction with a known value at the D input. Thus, the designer who utilizes such a device may not rely on the device output to be at a particular value between the time at which the device is powered up and shortly after the time at which predefined input stimulus is applied to the device. That the logical output values of sequential devices are unpredictable between the time of power up and shortly after the time predetermined stimulus is applied to the device is an accepted fact in the field of logical design.

The present invention utilizes that time interval between device power up and the application of stimulus that causes the device to be in a predictable state as the period during which test mode is active. That is, during this time interval the test layer of logic is activated and the test layer of logic controls the device outputs. Throughout this interval, the functional layer remains active to the extent that it responds to stimulus in the same manner as a device having the same functional attributes, but without the test layer, except that the functional layer does not control the outputs while the test layer is active. At the end of the time interval, the test layer is deactivated and the functional layer controls the outputs. Once deactivated, the test layer may not be reactivated except by cycling the power to the device off then on.

In addition to both the test and functional layers, the logical characteristics of which are not defined by the present invention, the present invention includes additional sense, monitor and control circuitry which first, determines the device power has reached at least a certain value, second, that a predefined time has elapsed during which other devices to which the device may be connected can be assumed to be in a suitable state and, third, that no stimulus thereafter has been applied to the device which could cause the functional layer of logic to be in other than an unpredictable state. This sensing, monitoring and controlling circuitry is used to activate the test layer of logic only between the time at which device power has, upon power up, reached a minimum value and the time at which the device may be in other than a fully unpredictable state.

Thus, utilizing a device containing the present invention, a designer who has no desire to utilize the test mode of the device may ignore it. That is, since the test mode is active only during the period before the test designer optionally causes predetermined stimulus to be applied to the device that will likely cause it to assume a defined state, the fact that the outputs are defined by the test logic response to device inputs will be indistinguishable from the outputs being undefined. Alternatively, the designer who wishes to utilize the test mode of the device will be able to do so by ensuring that the logical stimulus applied to the device is stable and in a certain subset of all possible states prior to the time interval allowed by the sensing circuitry noted above. That subset of input states are those that will not be sensed by the sensing circuitry as causing the functional layer of logic to be in other than a fully unpredictable state.

It is of paramount importance to ensure the test mode of a device incorporating the present invention does not remain activated when the surrounding circuitry requires the device to be in functional mode. Practical limitations of the sensing, monitoring and controlling circuitry to predict when the functional layer of logic is in a predictable state must be recognized as possibly detecting that the predictable state has occurred even in instances when it has not. The D-flip-flop previously cited provides a simple example. While sensing that the set input has been asserted, for example, may be used to deactivate the test mode, one may not be certain that the device has entered a predictable state. If, for example, the reset input were asserted and deasserted at the same times as this stimulus was provided to the set input, the output would still be in an unpredictable state. However, practical limitations of sensing circuit implementation will normally dictate that the sensing circuit will cause the device to switch from test mode to functional mode, for example, when one or more of the following conditions occur: the set input is asserted, the reset input is asserted or the clock input is asserted by transitioning in a particular direction.

It should be noted that the term "layer" has been used herein to provide clarity in distinguishing between the test and functional logical sections of a device and not to suggest a limitation imposed by the present invention on the physical design and manufacturing process of the device.

BRIEF DESCRIPTION OF THE DRAWINGS

FIG. 2b is a symbolic representation of the memory device of FIG. 2a.

DESCRIPTION AND OPERATION OF THE PREFERRED EMBODIMENT

Figure 1:
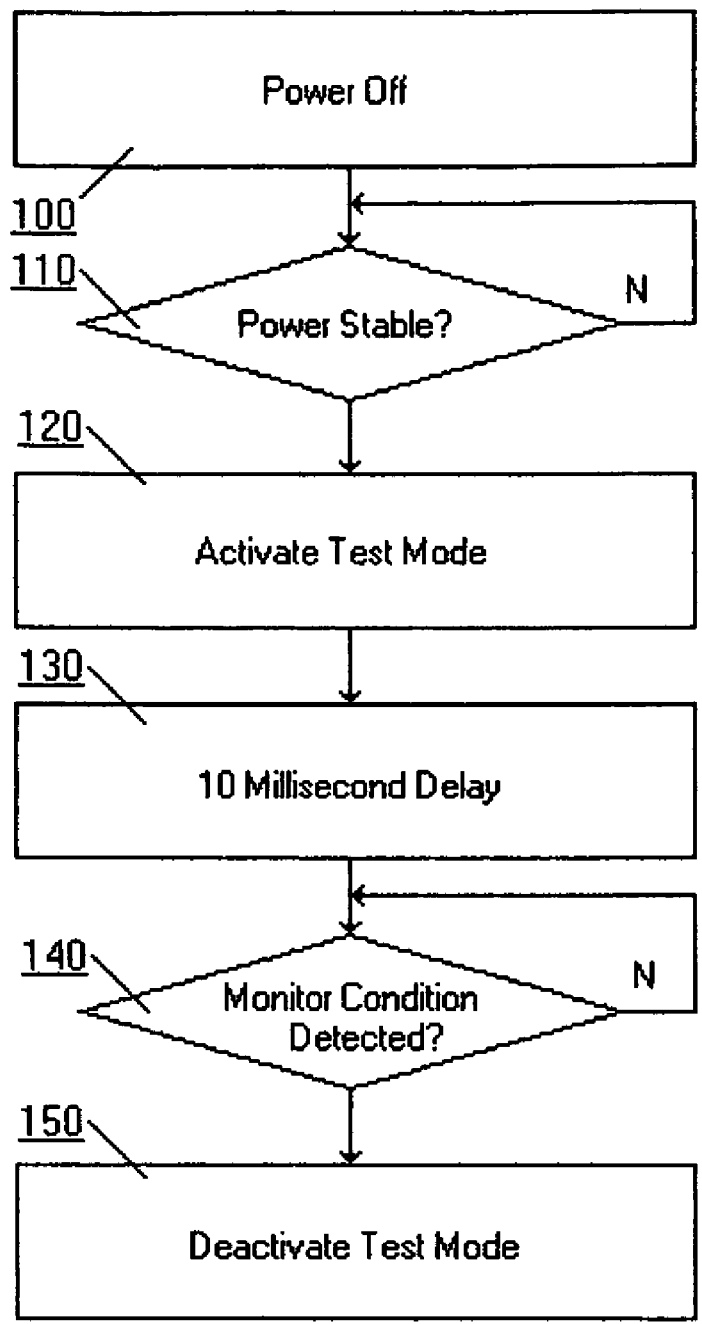
FIG. 1 is a flow chart showing the method of the present invention.
Figure 2A:
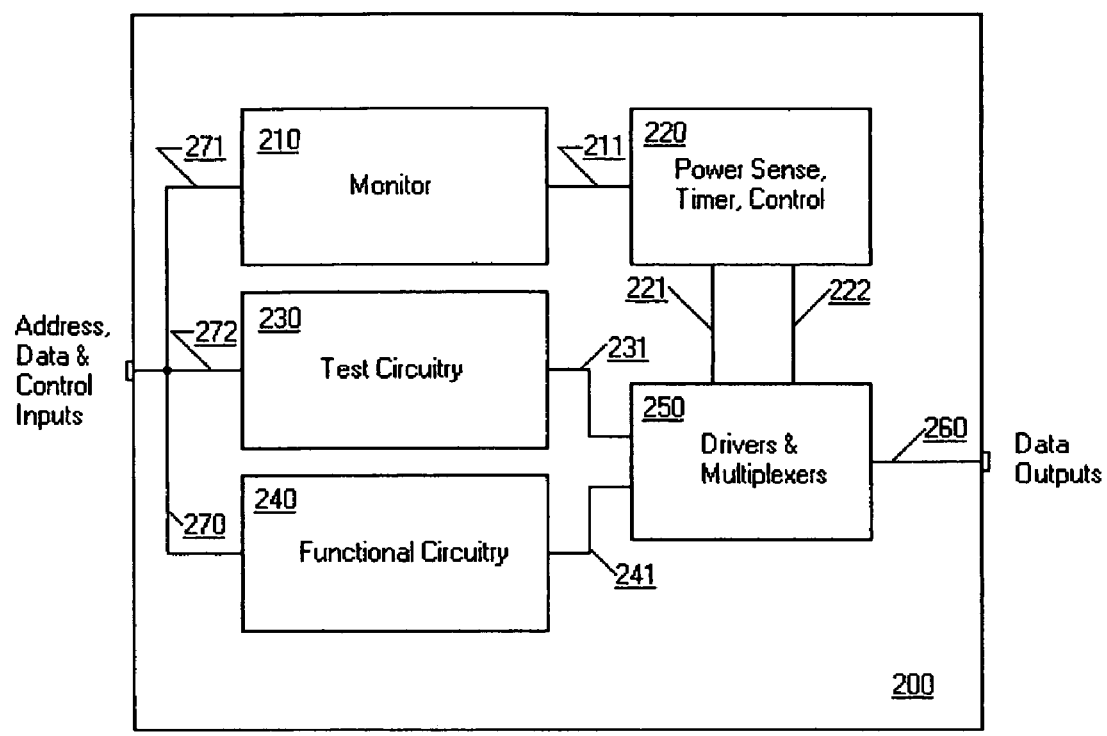
FIG. 2a is a block diagram showing the various sections of a device incorporating the present invention.
Figure 2B:
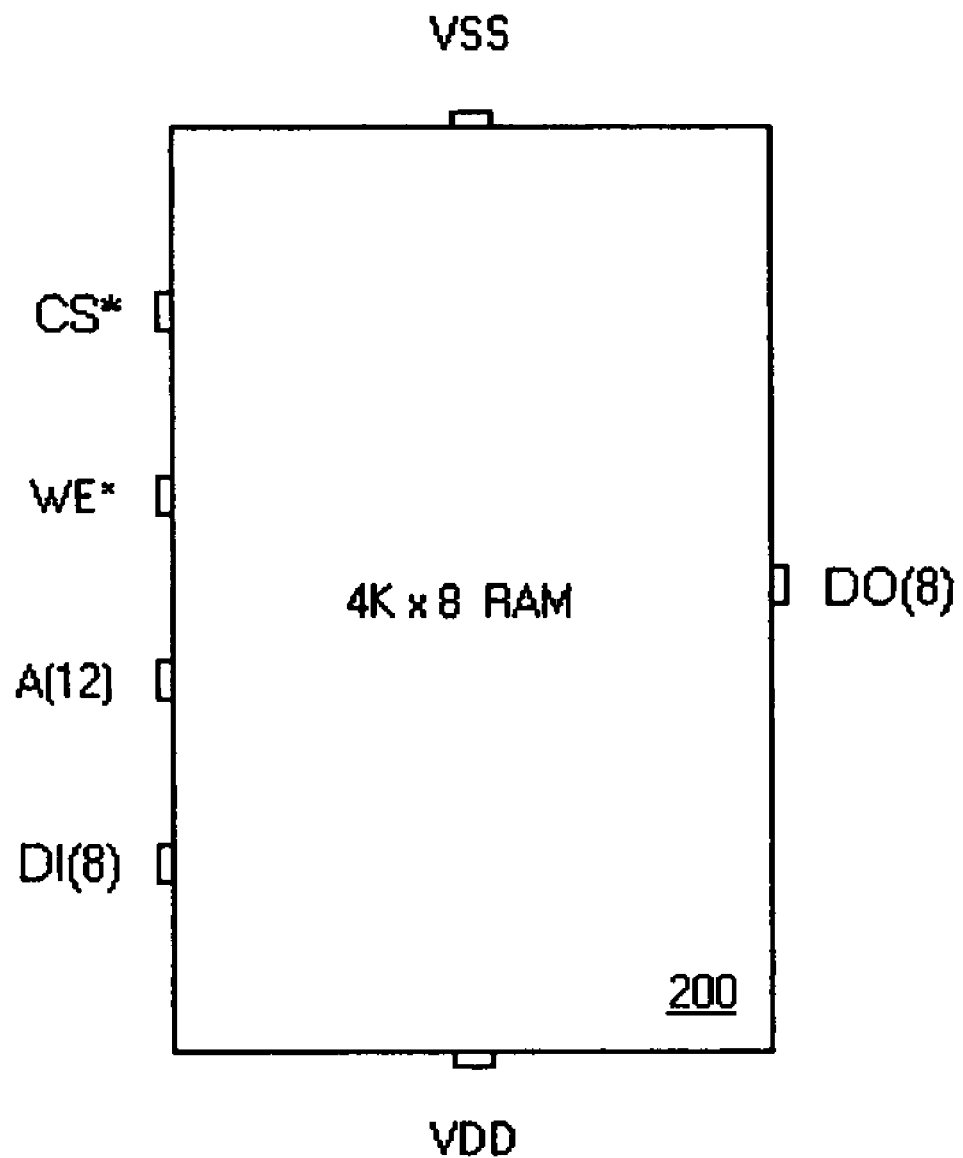

With reference to FIGS. 1, 2a and 2b, the principles of the present invention will now be described relative to its application to a particular device and system.

The memory device 200 shown in FIGS. 2a and 2b is a TTL 4,096×8 memory device having 32 connections: CS*, WE*, twelve address inputs labeled A(12), eight data inputs labeled DI(8), eight data outputs labeled DO(8), and two power connections labeled VSS and VDD. There are no extra connections included to activate or deactivate test mode or functional mode. Also, all possible combinations of logic input states of the memory device have a functional purpose. Therefore, there is no extra state or command available which may be used exclusively for test purposes, such as for activating or deactivating test mode without effecting the functional circuitry. Other devices to which the memory device incorporating the present invention may be connected are not shown in FIGS. 2a and 2b. This is because proper operation of the present invention does not rely on such external circuitry, other than for applying power.

The operation of memory device 200 will now be described in general terms so as to make its operation understandable to those familiar with such devices. The description does not include all details, such as timing details, which might be included in a datasheet of the device but which are not necessary to an understanding of the operation of the present invention. In the device of FIG. 2b, CS* is a negative enabled chip select. When CS* is low, the outputs are driven and writing to the memory is permitted. When WE* transcends from low to high in conjunction with CS* being low, the data present at the 8 data inputs DI is written into the memory address A present at the 12 address inputs. In functional mode, CS* being low causes the eight outputs DO to be driven with the contents of the memory location selected by the address present at the twelve A inputs. In test mode, CS* being low causes the outputs to be driven by the test circuitry in a pattern dependent on the pattern present at the address inputs A.

Although not part of the present invention, an example of the test circuitry of IEEE P1581 will now be described as an aid to understanding the application of devices incorporating the present invention. As shown, the memory device 200 has a total of 20 address and data inputs and 8 data outputs. When the test mode is active, seven of those 20 inputs are passed through inverters before being passed on to seven of the eight output drivers of the memory device 200. The remaining 13 of those 20 inputs are connected to the inputs of a 13 input XOR gate, the output of which is connected to the eighth output driver. In memory devices having more outputs than inputs, the each input is inverted and each output is driven by a unique combination of inverter outputs or sets of inverter outputs passed through an AND gate. In memory devices where the number of inputs equals the number of outputs, each output is uniquely driven by the inversion of one input. In a modified arrangement, using a counter, some of the DO outputs may be driven in patterns which vary according to the number of transitions of CS* occurring since power up. Thus, by utilizing test features, such as those of IEEE 1149.1, which may be present in the external devices to which memory device 200 is connected, in conjunction with the test circuitry of memory device 200 (when in test mode), relatively simple connectivity test patterns may be applied to and read from memory device 200.

The present invention is included in memory device 200 in addition to the circuitry necessary for the device to perform its normal function. That is, the additional test circuitry of the device is intended to be utilized only during specific test operations on the PCB. Once the tests have been completed, the additional test circuitry becomes essentially transparent so that the normal functionality of the device exists in essentially the same form as a like device absent the test circuitry. Also, the outputs of the device during test mode may be designed to have less than normal drive strength so as to minimize or eliminate possible problems that might exist when numerous such devices are connected together on a bus and the external signals necessary to prevent such conflicts have not been invoked or do not exist. While the primary application of the present invention is intended to be as an addition to memory devices, it may be used to benefit in other devices as well to provide testing benefit in certain circumstances.

For purposes of the current explanation, "test mode" refers to a mode of operation, invoked upon device power up, where the device outputs are controlled by the test circuitry of the device, but where the functional circuitry of the device is controlled in the same manner as when the device is in "functional mode." That is, the functional circuitry of the device responds to external stimulus in a like manner regardless of which mode the device is in, except that it has no control over the outputs of the device when in test mode. Thus, for example, the functional circuitry of device 200, when in test mode, will, when the input conditions exist to write data D in address A, write data D into address A, just as if the device had been in functional mode. Additionally, memory device 200 will deactivate test mode and activate functional mode as soon as practical. Once test mode has been deactivated, in cannot be reactivated except by powering the device down and then up.

It is also important to note that one primary goal of the present invention is that a device containing the present invention does not interfere with the functional operation of a PCB design where the test mode is not utilized. That is, when the PCB designer has chosen not to utilize the test benefits of a device incorporating the present invention, no special stimulus to the device will be required to prevent the test mode from interfering with PCB operation. Thus, a device incorporating the present invention will be able to be utilized interchangeably in PCBs which utilize the test mode and those PCBs which do not.

The method of operation of a device incorporating the present invention included on a PCB which has not been designed to take advantage of the test mode will now be described with reference to FIG. 1. The power off state of the PCB and the device is depicted by box 100. When power is applied, standard power sensing circuitry within the device is able to detect when power has reached a state at which it may be considered within limits and stable, as depicted by the looping path in decision box 110. The circuitry to perform this task is known to those familiar with the art and is discussed in IEEE 1149.1. Once power is sensed as being stable, boxes 120 and 130 are entered in turn wherein the test mode is invoked and a nominal delay is begun. In the preferred embodiment, the delay is 10 milliseconds, although longer or shorter delays may be designed into other embodiments and included as a device specification. The purpose of the delay is to allow circuitry external to the device, and perhaps even external to the PCB, time to stabilize when test mode is utilized. In this example, where the test mode will not be utilized, the delay specified in box 130 serves no purpose. Following the delay and upon entry into decision box 140, the device is still in test mode, even though, because of the PCB design of this example, it will not be utilized by circuitry external to the memory device. When in test mode, the memory device outputs react to device inputs in a predetermined manner, according to the design of the test mode of that device. However, in the case of a properly designed PCB, the logical values of the outputs of a memory device are ignored until after data has been written into the device. Therefore, it is of no consequence as to whether the data values present at the memory device outputs are the result of unknown data contained within the functional circuitry of the memory device or reflective, according to a test algorithm, of input values to the memory device.

Decision box 140 depicts the state of the memory device, in test mode and the monitoring of the inputs, until one or more predetermined conditions exist at the memory device inputs. When any of the predetermined conditions exists, decision box 140 is exited and box 150 entered. As indicated in box 150, the test mode is deactivated and the memory device outputs are then controlled exclusively by the functional circuitry. In memory device 200, the sole condition where box 140 is exited to box 150 is when CE* and WE* are low at the same time. In other embodiments, the condition(s) to deactivate test mode may be more or less complex. In box 150, the memory device outputs will correspond to memory contents during read operations as if the test logic were non-existent. As illustrated by the steps of FIG. 1, a memory device incorporating the present invention will not interfere with the operation of a PCB utilizing the device although there is no PCB circuitry to utilize the test mode of the present invention.

FIG. 1 will now be used to illustrate the differences in operation of a device incorporating the present invention on a PCB which has been designed to take advantage of the test mode of a memory device incorporating the present invention. During the 10 millisecond delay of box 130, predetermined input signal combinations that would be detected by the monitor function of box 140 are ignored. This delay affords the PCB designer the time to ensure that the test logic (e.g., IEEE 1149.1 circuitry) of other devices will not happen to be in any of the conditions or states in which the input monitor function of the memory device will be presented with an input combination which will cause test mode to be inadvertently deactivated. The test is now applied to the memory device, which is in test mode, via the other devices, by means of an IEEE 1149.1 test method or some other test method. As long as testing is desired, the test designer will avoid allowing stimulus which will trigger the memory device monitor function and reset test mode of the memory device. Finally, the test circuitry of the other devices (e.g., IEEE 1149.1 devices) will be reset and the PCB allowed to function normally, after which the test mode of the memory device, and all such similar memory devices, will be reset in due course of normal PCB operation. Alternatively, the final section of the test may include stimulus to reset test mode in the memory device(s).

In light of the above two descriptions of operation, both according to the flow shown in FIG. 1, it may be seen that a memory device incorporating the present invention will work properly either (A) as part of a PCB which is designed to utilize, first, the test mode benefit of the memory device and, then, the functional mode of the memory device or (B) as part of a PCB which is designed only to utilize the functional mode of the same memory device.

FIG. 2a illustrates in greater detail the memory device of FIG. 2b. As shown, device 200 has inputs 270. A subset of the inputs 270, labeled 271, are connected to a monitor circuit 210. In the preferred embodiment, the inputs 271 are CS* and WE*. Another subset of the inputs 270, labeled 272, are connected to a test circuitry block 230. In the preferred embodiment, the inputs 272 are the 12 address A inputs and the eight data DI inputs. In other embodiments, as noted previously, CS* may be included in input subset 272. All inputs 270 are connected to a functional circuitry block 240. The outputs of test circuitry block 230 and a functional circuitry block 240, which represents the circuitry of a conventional memory without a test mode, are selectively connected to output drivers by means of multiplexers, represented in block 250. The drivers and multiplexers in block 250 are controlled by the power sense, timer and control circuitry in block 220. Although the memory device outputs 260 and inputs 270 are shown to be separate in the preferred embodiment, in some devices a number of input and output pins may share the same connection (I/O pins). In the case of I/O pins, the subset of inputs 272 connected to block 230 will usually not include any of the same connections which are among the output connections 260.

The description of operation of the preferred embodiment of the present invention will now be described in relation to the flow chart of FIG. 1. As memory device 200 powers up, the circuitry in blocks 210, 230 and 240 function in much the same manner as normal logic circuitry. That is, their operation will not necessarily match that which may be expected once power has stabilized. The circuitry within block 220, however, is designed to sense that power to the memory device 200 has just been turned on and has reached a level whereby circuitry within the memory device, and by inference all PCB devices should be functioning normally. At this point, the circuitry within block 220 starts a 10 millisecond timer and, by means of control circuitry with block 220 and interconnect line 221, forces multiplexers within block 250 to a state whereby the test circuitry outputs of block 230 are connected through output drivers to outputs 260. At the same time, other control circuitry within block 220, via interconnect line 222, forces the same drivers to drive with less strength than they would during normal functional operation of memory device 200. While included in the preferred embodiment, other embodiments of the present invention may omit the lower drive strength capability during test mode, and utilize full drive strength in both test mode and functional mode. Also, during the delay period, the state of the connection 211 to block 210 is ignored, preventing the control function of block 220 to force the multiplexers within 250 to deselect the test circuitry and return the output drivers to full strength. Continuing with reference to FIG. 1, the point at which the timer function starts within block 220 corresponds to box 120 of FIG. 1. Box 130 corresponds to the period during which the timer function of block 220 begins and continues. When the timer function of block 220 has completed (i.e., after 10 milliseconds in the preferred embodiment), the interconnect line 211 from block 210 to block 220 is no longer ignored, meaning certain values at inputs 271 will be converted to a value on interconnect line 211 which will, by means of the control circuitry in block 220 and via interconnect line 221, cause the multiplexers in block 250 to switch such that the functional circuitry outputs 241 of block 240 are then connected to the output drivers of block 250. At this time, the drivers will then operate at full strength by virtue of the changed state of interconnect line 222 from block 220. The device 200 state after the timer of block 220 has completed its cycle corresponds to box 140 of FIG. 1. Box 150 corresponds to the state of device 200 after the multiplexers within block 250 have switched to connect the functional circuitry of block 240 to the output drivers of block 250, which will be operating at full strength as described above.

It should be noted that no problem to PCB operation is created when conditions exist whereby the test mode of a properly operating memory device incorporating the present invention is not deactivated during a given PCB operating session. For example, in using a memory device, such as one of the preferred embodiment, where test mode is deactivated only when data is written into the memory device, the memory device will remain in test mode until the condition for deactivating the test mode is met. If no data is written to the memory device between power up and power down, the memory device will remain in test mode throughout the session. However, this will not be a problem condition, since any reads that may have occurred from the memory device would not have been of properly written data, even in a memory device which did not contain test circuitry. Thus, the integrity of operation is maintained as if the device did not contain circuitry of the present invention.

From the above it is seen that the present invention provides a number of advantages over prior methods of PCB testing. For example, no extra connections to the memory device are required beyond those necessary to carry out the normal functional operation of the memory device. A further example is that no special input signal combination codes are required beyond those necessary to carry out the normal functional operation of the memory device. A still further example of the advantages of the present invention is that the dual mode operation of the device creates no significant difference from operation of a device of equivalent functionality, but without the circuitry of the present invention. Thus, the dual mode operation of the present invention is essentially transparent to users who may not only be uninterested in utilizing the test mode, but unwilling to incorporate special circuitry external to the device to avoid the effects of invoking test mode in other devices not incorporating the present invention.

While a block diagram approach has been used to describe the present invention, it will be apparent to those skilled in the art as to the specific circuits required to perform the functions contained within the illustrated blocks. For example, the monitor block 210 in memory device 200 could be implemented with an OR gate.

The invention claimed is:

1. A method of allowing a test mode of operation and a functional mode of operation of an electronic device wherein the device includes a number of inputs and outputs, test circuitry for carrying out the test mode of operation, functional circuitry for carrying out the functional mode of operation, monitor circuitry for detecting predetermined combinations of input signal states, power sense circuitry for detecting when power to the device is stable, timer circuitry for allowing a delay function, control circuitry for switching between the two modes of operation and multiplexer and driver circuitry including output drivers for selectively applying the outputs of either the test circuitry or the functional circuitry to a set of output terminals, the method comprising the following steps of operation:
    (a) directly after power up of the device, waiting until power to the device becomes stable,
    (b) at the completion of step (a), activating the test mode of operation during which the outputs of the device are controlled by the test circuitry and during which the functional circuitry operates normally in all respects in responding to input stimulus, but not in controlling the outputs of the device,
    (c) activating the delay function during which the test mode cannot be deactivated,
    (d) at the completion of the delay function of step (c), monitoring the inputs of the device until one of a number of specified conditions is detected and
    (e) when one of the number of specified conditions is detected in step (d), deactivating the test mode of operation and activating the functional mode of operation after which activation the outputs of the device are controlled by the functional circuitry and wherein at least one of the number of specified conditions is defined by a combination of input signals which cause the state of at least one part of the functional circuitry of the device to become a known state and wherein at least one of the number of specified conditions corresponds to a command which causes data to be written into the functional circuitry of the electronic device.

2. The method of claim 1 wherein the electronic device is a memory.

3. The method of claim 1 wherein the electronic device is any device which powers up in a fully or partially unknown state.

4. The method of claim 1 wherein the test mode of operation further causes the output drivers to operate at reduced strength.

5. Apparatus for providing a test mode of operation and functional mode of operation of an electronic device wherein the device includes a number of inputs and outputs, test circuitry for carrying out the test mode of operation of the device and functional circuitry for carrying out the functional mode of operation of the device, the apparatus comprising:
    (a) output selection and driver circuitry for selectively applying the outputs of the test circuitry to the output terminals of the device, when in test mode of operation, or the outputs of the functional circuitry to the output terminals of the device, when in functional mode of operation,
    (b) control circuitry to cause the output selection and driver circuitry to switch between the test circuitry when in test mode of operation and the functional circuitry when in functional mode of operation,
    (c) power sensing circuitry operative directly after power up of the device, for determining when power to the device becomes stable,
    (d) the power sensing circuitry including circuits for activating the control circuitry for the test mode of operation, during which the device outputs are controlled by the test circuitry,
    (e) delay circuitry being activated by the power sensing circuitry for providing a delay function during which the test mode of operation cannot be deactivated and
    (f) monitoring circuitry, the inputs of which are connected to predetermined ones of the inputs for monitoring the inputs of the device until one of a number specified conditions is detected and
    (g) the monitoring circuitry including an output connected to the control circuitry to cause the test mode of operation to be deactivated and the functional mode of operation to be activated, after which the device outputs are controlled by the functional circuitry and wherein at least one of the number of specified conditions is defined by a combination of input signals which cause the state of at least one part of the functional circuitry of the device to become a known state and wherein at least one of the number of specified conditions corresponds to a command which causes data to be written into the functional circuitry of the electronic device.

6. The apparatus of claim 5 wherein the electronic device is a memory.

7. The apparatus of claim 5 wherein the electronic device is any which powers up in a fully or partially unknown state.

8. The apparatus of claim 5 wherein the control circuitry when in test mode further causes the output drivers to operate at reduced strength.

9. A method of allowing a test mode of operation and subsequent functional mode of operation of an electronic device wherein the device includes a number of inputs and outputs, test circuitry for carrying out the test mode of operation and functional circuitry for carrying out the functional mode of operation, the method comprising the following steps:
   (a) in response to powering up of the device and after power to the device becomes stable, activating the test mode of operation of the device, during which the outputs of the device are controlled by test circuitry, but during which the functional circuitry operates normally in all respects to input stimulus, except that it does not control the outputs of the device;
   (b) preventing the test mode of the test circuitry from being deactivated for a predetermined period of time; and,
   (c) after the predetermined period of time has elapsed, deactivating the test mode of operation of the device upon occurrence of one of a number of specified conditions and activating the functional mode of operation of the device wherein the outputs of the device are controlled by the functional circuitry and wherein at least one of the number of specified conditions is defined by a combination of input signals which cause the state of at least one part of the functional circuitry of the device to become a known state and wherein at least one of the number of specified conditions corresponds to a command which causes data to be written into the functional circuitry of the electronic device.

10. The method of claim 9 wherein the electronic device is a memory and the predetermined period of time is established by activating a delay function.

* * * * *